(12) United States Patent
Wu et al.

(10) Patent No.: US 7,563,860 B2
(45) Date of Patent: Jul. 21, 2009

(54) SEMICONDUCTORS AND ELECTRONIC DEVICES GENERATED THEREFROM

(75) Inventors: Yiliang Wu, Mississauga (CA); Ping Liu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 567 days.

(21) Appl. No.: 11/399,141

(22) Filed: Apr. 6, 2006

(65) Prior Publication Data

US 2007/0235724 A1    Oct. 11, 2007

(51) Int. Cl.
*C08G 75/00* (2006.01)
(52) U.S. Cl. .......................... 528/380; 257/40
(58) Field of Classification Search ............... 528/422
See application file for complete search history.

(56) References Cited

U.S. PATENT DOCUMENTS

| | | | |
|---|---|---|---|
| 5,619,357 A | 4/1997 | Angelopoulos et al. | |
| 5,777,070 A | 7/1998 | Inbasekaran et al. | |
| 5,969,376 A | 10/1999 | Bao | |
| 6,107,117 A | 8/2000 | Bao et al. | |
| 6,150,191 A | 11/2000 | Bao | |
| 6,770,904 B2 | 8/2004 | Ong et al. | |
| 2005/0017311 A1 | 1/2005 | Ong et al. | |
| 2005/0038223 A1* | 2/2005 | Becker et al. | 528/86 |

OTHER PUBLICATIONS

Ong, Beng, et al., U.S. Appl. No. 11/011,678, filed Dec. 14, 2004 on Compound with Indolocarbazole Moieties and Devices Containing Such Compound.
Ong, Beng, et al., U.S. Appl. No. 11/167,512, filed Jun. 27, 2005 on Compound with Indolocarbazole Moieties and Devices Containing Such Compound.
Huang, D.H., et al., "Conjugated Polymers Based on Phenothiazine and Fluorene in Light-Emitting Diodes and Field Effect Transistors", *Chem. Mater.* 2004, 16, 1298-1303.
Zhu, Y., et al., "Phenoxazine-Based Conjugated Polymers: A New Class of Organic Semiconductors for Field-Effect Transistors", *Macromolecules* 2005, 38, 7983-7991.

* cited by examiner

*Primary Examiner*—Randy Gulakowski
*Assistant Examiner*—Shane Fang
(74) *Attorney, Agent, or Firm*—Eugene O. Palazzo; Fay Sharpe LLP

(57) ABSTRACT

An electronic device containing a polymer of Formula (I), Formula (II), or mixtures, or isomers thereof (I)

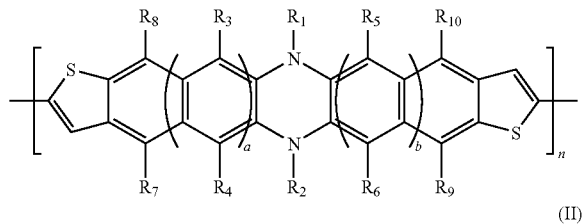

(II)

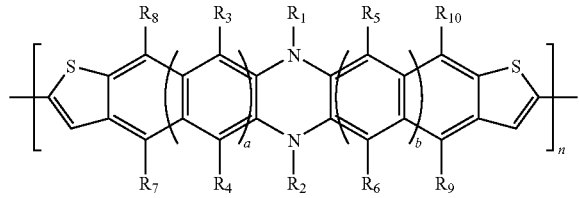

wherein each $R_1$ through $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties.

33 Claims, 2 Drawing Sheets

US 7,563,860 B2

SEMICONDUCTORS AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS REFERENCE TO RELATED APPLICATIONS

U.S. Pat. No. 7,372,071 filed Apr. 6, 2006, on Functionalized Heteroacenes and Electronic Devices Generated Therefrom, by Yuning Li et al.

U.S. application Ser. No. 11/399,226, filed Apr. 6, 2006, on Functionalized Heteroacenes, by Yuning Li et al.

U.S. application Ser. No. 11/399,216, filed Apr. 6, 2006, on Polyacenes and Electronic Devices Generated Therefrom, by Yuning Li et al.

U.S. application Ser. No. 11/399,064, filed Apr. 6, 2006, on Heteroacene Polymers and Electronic Devices Generated Therefrom, by Yuning Li et al.

U.S. application Ser. No. 11/399,169, filed Apr. 6, 2006, on Ethynylene Acene Polymers and Electronic Devices Generated Therefrom, by Yuning Li et al.

U.S. application Ser. No. 11/399,091, filed Apr. 6, 2006, on Ethynylene Acene Polymers, by Yuning Li et al.

U.S. Pat. No. 7,449,715, filed Apr. 6, 2006, on Poly[bis(ethynyl)heteroacenes] and Electronic Devices Generated Therefrom, by Yuning Li et al.

U.S. application Ser. No. 11/399,230, filed Apr. 6, 2006, on Semiconductor Polymers, by Yiliang Wu et al.

U.S. application Ser. No. 11/398,941, filed Apr. 6, 2006, on Polydiazaacenes and Electronic Devices Generated Therefrom, by Yiliang Wu et al.

U.S. application Ser. No. 11/398,902, filed Apr. 6, 2006, on Polydiazaacenes, by Yiliang Wu et al.

U.S. application Ser. No. 11/398,931, filed Apr. 6, 2006, on Poly(alkynylthiophene)s and Electronic Devices Generated Therefrom, by Beng S. Ong et al.

U.S. application Ser. No. 11/399,246, filed Apr. 6, 2006, on Poly(alkynylthiophene)s, by Beng S. Ong et al.

U.S. application Ser. No. 11/399,092, filed Apr. 6, 2006, on Linked Arylamine Polymers and Electronic Devices Generated Therefrom, by Yuning Li et al.

U.S. application Ser. No. 11/399,065, filed Apr. 6, 2006, on Linked Arylamine Polymers, by Yuning Li et al.

Illustrated in U.S. application Ser. No. 11/011,678, filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference. In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and patent may be selected for the present invention in embodiments thereof.

BACKGROUND

The present disclosure is generally directed to semiconductors of the formulas as illustrated herein and generated, for example, from monomers containing two tertiary amines for stability primarily, and two thieno groups, processes of preparation and uses thereof. More specifically, the present disclosure in embodiments is directed to novel polymers of the formulas as illustrated herein and generated, for example, from monomers containing two tertiary amines for stability primarily, and two thieno groups at each end point of the monomer which permits, for example, extended polymer conjugation after polymerization, and which can be selected as solution processable and substantially stable channel semiconductors in organic electronic devices, such as thin film transistors.

There are desired electronic devices, such as thin film transistors, TFTs, fabricated with a semiconductor of the formulas as illustrated herein, and which semiconductors possess excellent solvent solubility, and which can be solution processable; and which devices possess mechanical durability and structural flexibility, characteristics which are desirable for fabricating flexible TFTs on plastic substrates. Flexible TFTs enable the design of electronic devices with structural flexibility and mechanical durability characteristics. The use of plastic substrates together with the semiconductor of the formulas as illustrated herein and generated, for example, from monomers containing two tertiary amines for stability primarily, and, for example, two thieno groups, can transform the traditionally rigid silicon TFT into a mechanically more durable and structurally flexible TFT design. This can be of particular value to large area devices such as large-area image sensors, electronic paper and other display media. Also, the selection of p-type semiconductors of the formulas as illustrated herein and generated, for example, from monomers containing two tertiary amines at the center portion of the monomeric unit of the polymer structure for stability primarily, and two thieno end or termination groups of the monomeric unit of the polymer structure for extended conjugation for integrated circuit logic elements for low end microelectronics, such as smart cards, radio frequency identification (RFID) tags, and memory/storage devices, may enhance their mechanical durability, and thus their useful life span.

A number of semiconductor materials are not, it is believed, stable when exposed to air as they become oxidatively doped by ambient oxygen resulting in increased conductivity. The result is large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Regioregular polyhexylthiophenes usually undergo rapid photo oxidative degradation under ambient conditions, while the know polytriarylamines possess some stability when exposed to air, however, these amines are believed to possess low field effect mobilities, disadvantages avoided or minimized with the polymers of the formulas as illustrated herein.

Also, acenes, such as pentacene, and heteroacenes are known to possess acceptable high filed effect mobility when used as channel semiconductors in TFTs. However, these materials can be rapidly oxidized by, for example, atmospheric oxygen under light, and such compounds are not considered processable at ambient conditions. Furthermore, when selected for TFTs, acenes have poor thin film formation characteristics and are substantially insoluble, thus they are essentially nonsolution processable; accordingly, such compounds have been processed by vacuum deposition methods that result in high production costs, eliminated or minimized with the TFTs generated with the semiconductors illustrated herein.

A number of organic semiconductor materials has been described for use in field effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers such as sexithiophenes or their variants, see for example reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags.

TFTs fabricated from p-type semiconductor polymers of the formulas illustrated herein may be functionally and structurally more desirable than conventional silicons in that they may offer mechanical durability, structural flexibility, and the potential of being able to be incorporated directly onto the active media of the devices, thus enhancing device compactness for transportability. Also, a number of known small molecule or oligomer-based TFT devices rely on difficult vacuum deposition techniques for fabrication. Vacuum deposition is selected primarily because the materials selected are either insoluble or their solution processing by spin coating, solution casting, or stamp printing do not generally provide uniform thin films.

Further, vacuum deposition may also involve the difficulty of achieving consistent thin film quality for large area format. Polymer TFTs, such as those fabricated from regioregular components, of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit large off-current, very low current on/off ratios, and their performance characteristics degrade rapidly.

Illustrated in Huang, D. H., et al, *Chem. Mater.* 2004, 16, 1298-1303, are, for example, LEDS and field effect transistors based on certain phenothiaazines like poly(10-(2-ethylhexyl)phenothiaazine).

Illustrated in Zhu, Y., et al, *Macromolecules* 2005, 38, 7983-7991, are, for example semiconductors based on phenoxazine conjugated polymers like poly(10-hexylphenoxazine).

Additional references that may be of interest include U.S. Pat. Nos. 6,150,191; 6,107,117; 5,969,376; 5,619,357, and 5,777,070.

BRIEF DESCRIPTION OF THE DRAWINGS

Illustrated in FIGS. 1 to 4 are various representative embodiments of the present disclosure, and wherein p-type semiconductors of the formulas as illustrated herein and generated, for example, from monomers containing two tertiary amines for stability primarily, and two thieno groups for extended conjugation primarily are selected as the channel or semiconductor material in thin film transistor (TFT) configurations.

DESCRIPTION OF THE EXEMPLARY EMBODIMENTS

Figure 1:
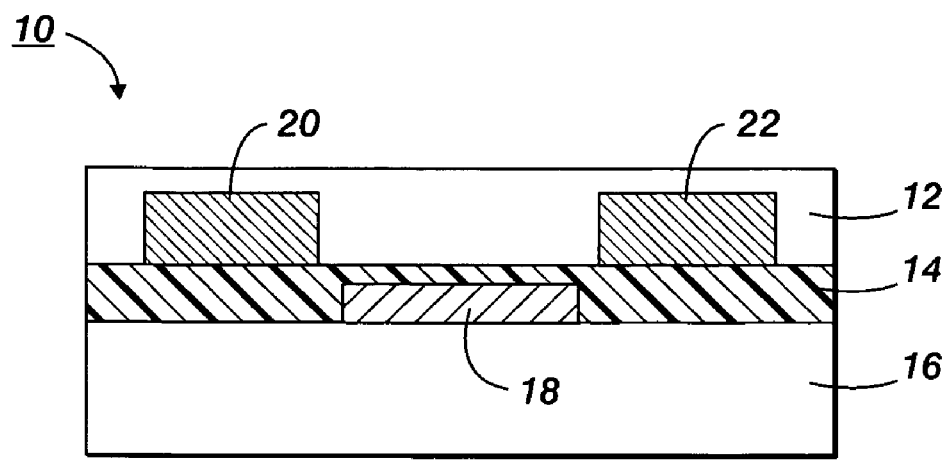

It is a feature of the present disclosure to provide p-type semiconductors of the formulas as illustrated herein which are useful for microelectronic device applications, such as TFT devices.

It is another feature of the present disclosure to provide p-type semiconductors of the formulas as illustrated herein with a band gap of from about 1.5 eV to about 3 eV as determined from the absorption spectra of thin films thereof.

In yet a further feature of the present disclosure there is provided p-type semiconductors of the Formulas I and II illustrated herein which are useful as microelectronic components, and which polymers possess a solubility of, for example, at least about 0.1 percent to about 95 percent by weight in common organic solvents, such as methylene chloride, tetrahydrofuran, toluene, xylene, mesitylene, chlorobenzene, dichlorobenzene, trichlorobenzene and the like, and thus these polymers can be economically fabricated by solution processes such as spin coating, screen printing, stamp printing, dip coating, solution casting, jet printing, and the like.

Another feature of the present disclosure resides in providing electronic devices, such as TFTs, with p-type semiconductors of the formulas as illustrated herein as channel layer, and which layer has a conductivity of from about $10^{-4}$ to about $10^{-9}$ S/cm (Siemens/centimeter).

Also, in yet another feature of the present disclosure there are provided novel p-type semiconductors of the formulas as illustrated herein and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene-3,5-diyl) or with acenes.

Additionally, in a further feature of the present disclosure there is provided a class of novel p-type semiconductors of the formulas as illustrated herein with unique structural features which are conducive to molecular self-alignment under appropriate processing conditions, and which structural features also enhance the stability of device performance. Proper molecular alignment can permit higher molecular structural order in thin films, which can be important to efficient charge carrier transport, thus higher electrical performance.

There are disclosed in embodiments a polymer, and more specifically, p-type semiconductors of the formulas as illustrated herein and electronic devices thereof. More specifically, the present disclosure relates to semiconductor polymers illustrated by or encompassed by Formula (I)

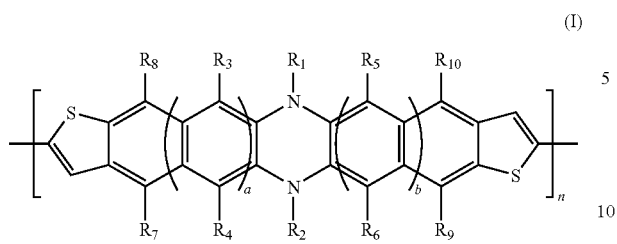
(I)

or by Formula (II)

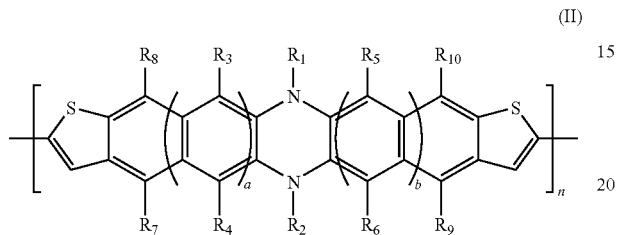
(II)

wherein the monomeric unit of Formula (II) is an isomer of the monomeric unit of Formula (I), wherein, for example, each $R_1$ through $R_{10}$ is independently hydrogen, alkyl, aryl, alkoxy, arylalkyl, alkyl substituted aryls, except that $R_1$ and $R_2$ exclude halogen, cyano, nitro and the like; a and b represent the number of rings, each of them being, for example, from 0 to about 3; and n represents the number of units, such as for example, n is a number of from about 2 to about 2,000, and more specifically, from about 2 to about 1,000, or from about 100 to about 700, or from about 2 to about 50, or mixtures of I and II, for example, from about 5 percent to about 95 percent by weight of I and from about 95 to about 5 percent of II.

The number average molecular weight ($M_n$) of the polymer in embodiments can be, for example, from about 500 to about 300,000, including from about 500 to about 100,000, and the weight average molecular weight ($M_w$) thereof can be from about 600 to about 500,000, including from about 600 to about 200,000, both as measured by gel permeation chromatography using polystyrene standards.

In embodiments, a specific class of p-type channel semiconductors are represented by the following formulas

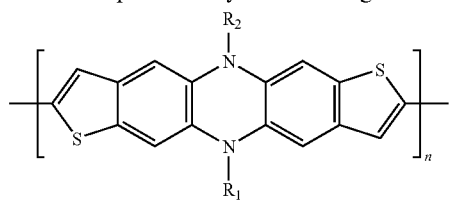
(1)

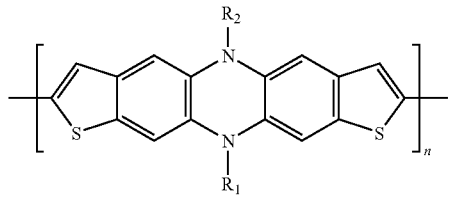
(2)

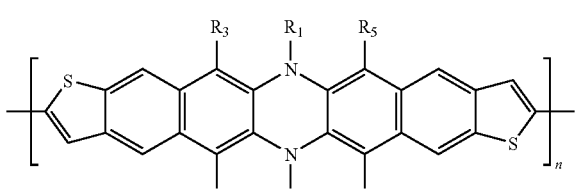
(3)

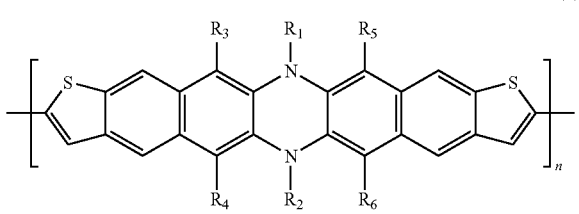
(4)

wherein each $R_1$ through $R_6$ is, for example, independently hydrogen, a suitable hydrocarbon like alkyl, aryl, alkoxy, arylalkyl, alkyl substituted aryls, and the like; and mixtures thereof; and n represents the number of units, such as for example, n is a number of from about 2 to about 5,000, and more specifically, from about 2 to about 1,000 or from about 2 to about 700. In embodiments, $R_1$ through $R_6$ are, more specifically, alkyl, arylalkyl, and alkyl substituted aryls. Yet more specifically, $R_1$ and $R_2$ are alkyl with about 5 to about 20 carbon atoms of, for example, pentyl, hexyl, heptyl, octyl, nonyl, decyl, undecyl, dodecyl, tridecyl, tetradecyl, pentadecyl, hexadecyl, heptadecyl or octadecyl; arylalkyl with about 7 to about 26 carbon atoms of, for example, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl.

In embodiments there are disclosed processes for the preparation of p-type semiconductors of the formulas as illustrated herein in accordance, for example, with the following reaction scheme Scheme 1

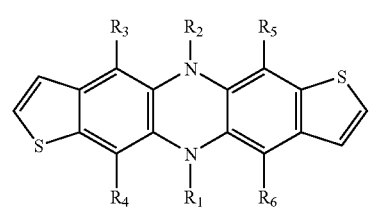 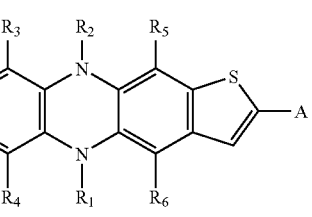

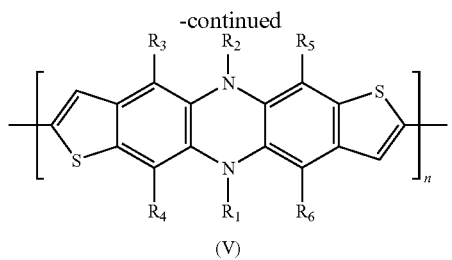

(V)

More specifically, the process for the preparation of the polymer semiconductor of the formulas as illustrated herein can be accomplished by, for example, the oxidative coupling polymerization of monomer (III) in the presence of oxidative coupling agent of, for example, $FeCl_3$ at elevated temperatures of, for example, from room temperature to about 80° C., or by the dehalogenative coupling polymerization of monomer (IV) in the presence of zinc, nickel(II)chloride, 2,2'-dipyridil, and triphenylphosphine in dimethylacetamide (DMAc) at elevated temperatures of, for example, from about 70° C. to about 90° C., and more specifically, about 80° C. for a suitable period of time, like 24 hours. In Scheme 1, each $R_1$ through $R_6$ is as illustrated herein like hydrogen, alkyl, aryl, alkoxy, arylalkyl, alkyl substituted aryls, and the like; and mixtures thereof; and n represents the number of units, such as for example, n is a number of from about 2 to about 500, and more specifically, from about 2 to about 1,000, or from about 2 to about 700.

Examples of each of the R groups (including $R_1$ through $R_{10}$) include alkoxy and alkyl with, for example, from about 1 to about 30, including from about 4 to about 18 carbon atoms (included throughout are numbers within the range, for example 4, 5, 6, 7, 8, 9, 10, 11, 12, 13, 14, 15, 16, 17 and 18), and further including from about 6 to about 16 carbon atoms, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, isomeric forms thereof, mixtures thereof, and the like, and the corresponding alkoxides, such as propoxy and butoxy; alkylaryl with from about 7 to about 50 carbon atoms, from about 7 to about 37 carbon atoms, from about 12 to about 25 carbon atoms, such as alkyl phenyls like methyl phenyl, substituted phenyls; aryl with from 6 to about 48 carbon atoms and, more specifically, with from about 6 to about 18 carbon atoms, such as phenyl. Halogen includes chloride, bromide, fluoride and iodide. Heteroatoms and hetero containing groups include, for example, polyethers, trialkylsilyls, heteroaryls, and the like; and more specifically, thienyl, furyl and pyridiaryl. The hetero component can be selected from a number of known atoms like sulfur, oxygen, nitrogen, silicon, selenium, and the like.

Specific illustrative polymer semiconductors are

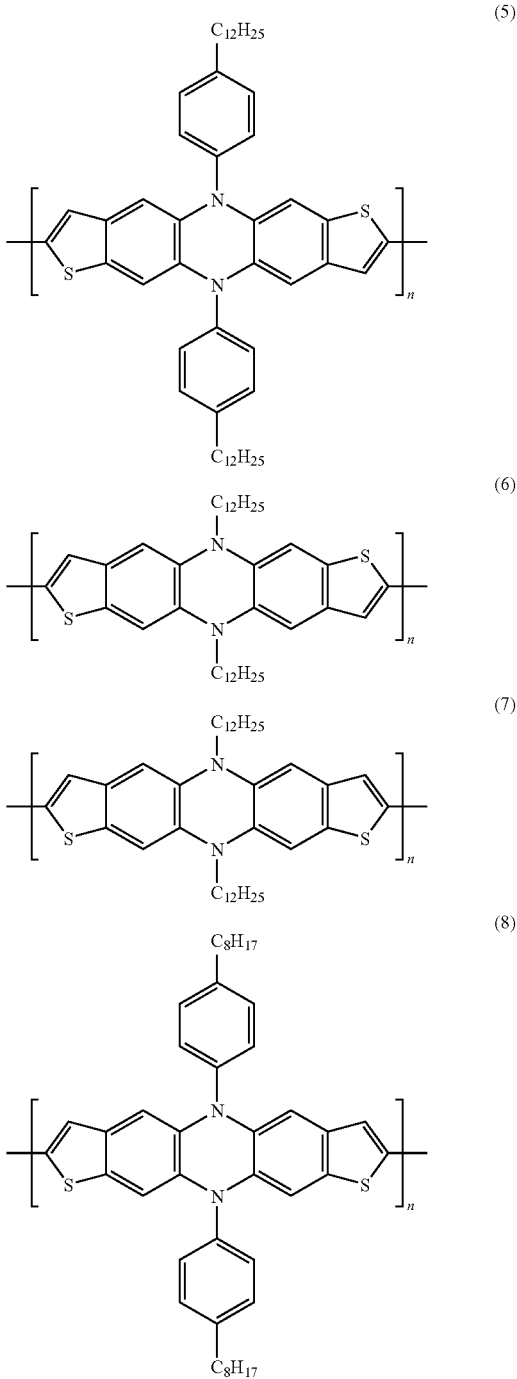

wherein n is, for example, from about 2 to about 50.

The polymer semiconductors are soluble or substantially soluble in common coating solvents, for example, in embodiments they possess a solubility of at least about 0.1 percent by weight, and more specifically, from about 0.5 percent to about 10 percent, or to about 95 percent by weight in such solvents as methylene chloride, 1,2-dichloroethane, tetrahydrofuran, toluene, xylene, mesitylene, chlorobenzene, dichlorobenzene, and the like. Moreover, p-type semiconductors of the formulas as illustrated herein and generated, for example, from monomers containing two tertiary amines for stability primarily, and two thieno groups for extended conjugation of the present disclosure in embodiments when fabricated as semiconductor channel layers in TFT devices provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that p-type semiconductors disclosed when fabricated from solutions as thin films of, for example, from about 10 nanometers to about 500 nanometers or from about 50 to about 300 nanometers in thickness materials are more stable in ambient conditions than similar devices fabricated from poly(3-alkylthiophene-2,5-diyl). When unprotected, the aforementioned p-type semiconductors of the formulas as illustrated herein and devices thereof are generally stable for a number of weeks rather than days or hours as is the situation with poly(3-alkylthiophene-2,5-diyl) after exposure to ambient oxygen, thus the devices fabricated from p-type semiconductors of the formulas as illustrated herein and generated, for example, from monomers containing two tertiary amines for stability primarily, and two thieno groups in embodiments of the present disclosure can provide higher current on/off ratios, and their performance characteristics do not substantially change as rapidly as poly(3-alkylthiophene-2,5-diyl) when no rigorous procedural precautions have been taken to exclude ambient oxygen during material preparation, device fabrication, and evaluation. P-type semiconductors disclosed are in embodiments stable, that is they do not substantially degrade when exposed to oxygen.

Aspects of the present disclosure relate to an electronic device comprising a semiconductor selected from the group consisting of at least one of Formula (I), Formula (II), or mixtures thereof

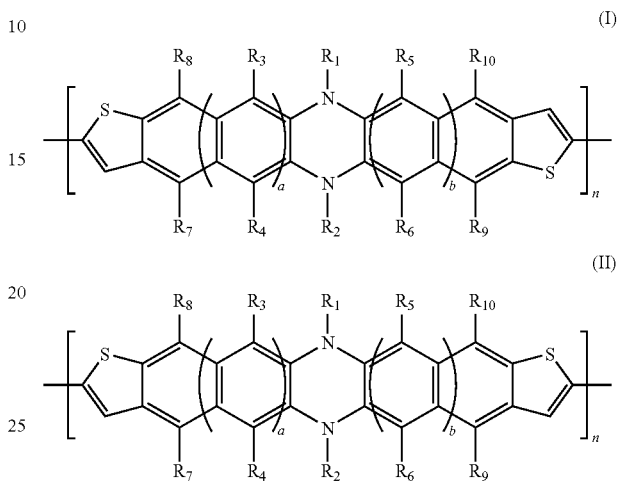

wherein each $R_1$ through $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties; a thin film transistor comprised of a substrate, a gate electrode, a gate dielectric layer, a source electrode and a drain electrode, and in contact with the source/drain electrodes and the gate dielectric layer a semiconductor layer comprised of at least one component or mixtures thereof of the following formulas

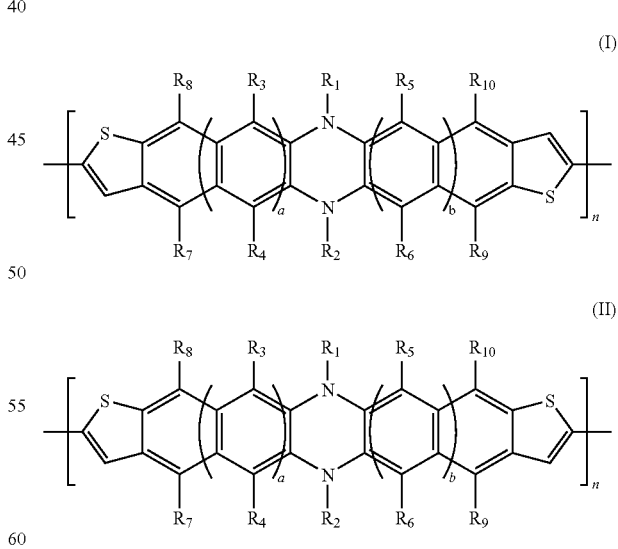

wherein each $R_1$ through $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties; an electronic device comprising a semiconductive component and wherein said device is a thin film transistor, and said component is selected from the group consisting of or mixtures thereof wherein at least one of $R_1$ to $R_{10}$ is a suitable hydrocarbon; a and b represent the number of rings; and n represents the number of repeating units; a polymer comprising those selected from the group consisting of at least one of Formula (I), Formula (II), or mixtures thereof

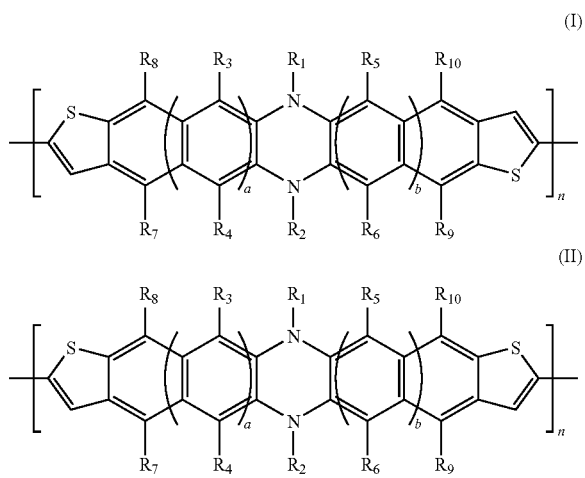

wherein each $R_1$ to $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the poly(3-alkynylthiophene) layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; device or devices include electronic devices such as TFTs.

DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 on top of which layer 14 two metal contacts, 20 and 22 (source and drain electrodes), are deposited. Over and situated between the metal contacts 20 and 22 is the p-type semiconductor of Formula (5) wherein n is 50, layer 12. The gate electrode can be included in the substrate, in the dielectric layer, and the like throughout.

Figure 2:
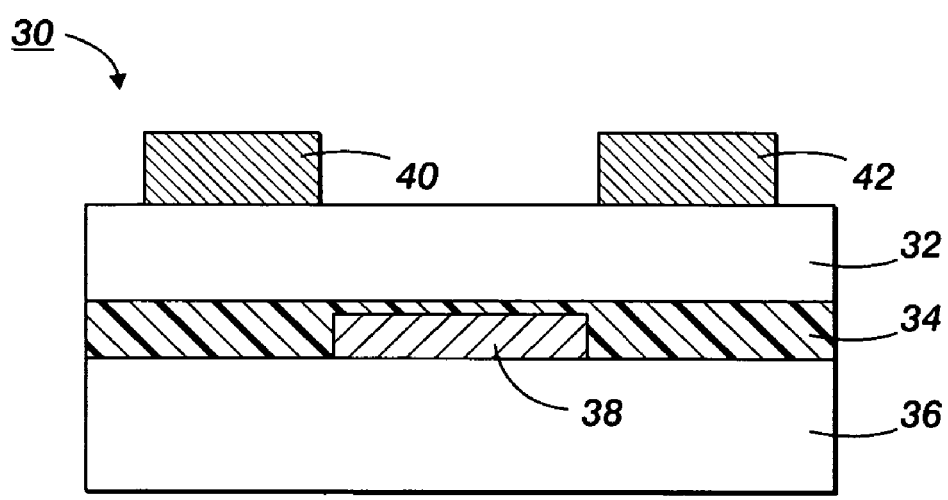

FIG. 2 schematically illustrates another TFT configuration 30 comprised of a substrate 36, a gate electrode 38, a source electrode 40, and a drain electrode 42, an insulating dielectric layer 34, and p-type semiconductor layer 32 of Formula (5) wherein n is 50.

Figure 3:
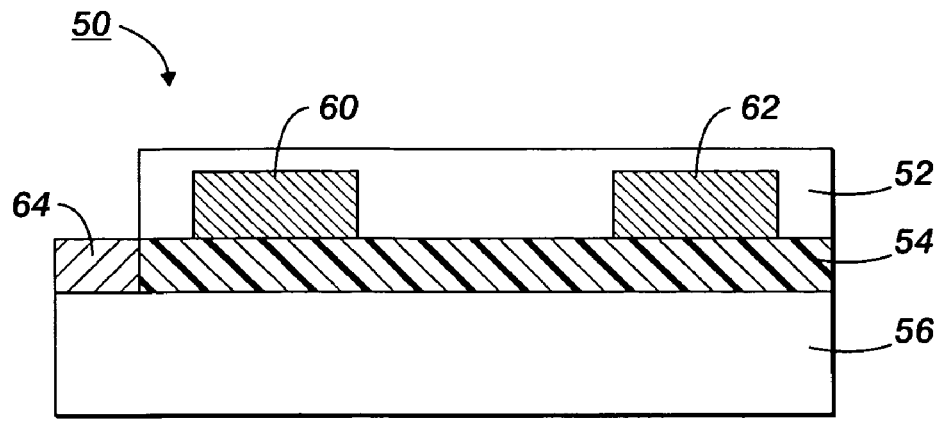

FIG. 3 schematically illustrates a further TFT configuration 50 comprised of a heavily n-doped silicon wafer 56, which can act as a gate electrode, a thermally grown silicon oxide dielectric layer 54, p-type semiconductor layer 52 of Formula (5) wherein n is 50, on top of which are deposited a source electrode 60 and a drain electrode 62; and a gate electrode contact 64.

Figure 4:
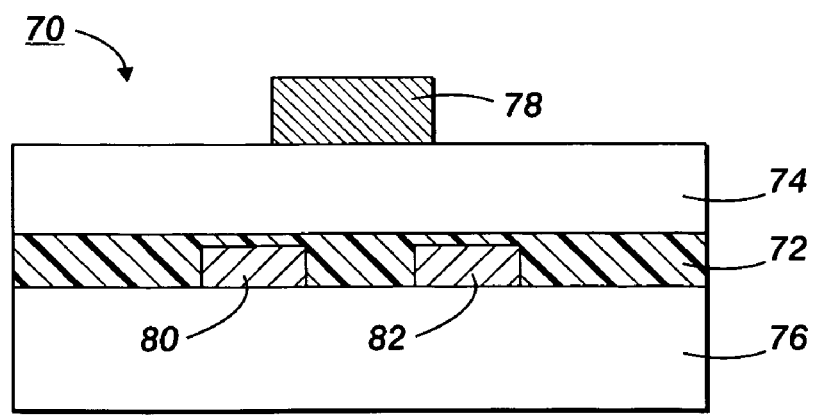

FIG. 4 schematically illustrates a TFT configuration 70 comprised of substrate 76, a gate electrode 78, a source electrode 80, a drain electrode 82, p-type semiconductors of the formulas as illustrated herein semiconductor layer 72 of Formula (5) wherein n is 50, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ $F/cm^2$.

Situated, for example, between and in contact with the dielectric layer and the source/drain electrodes is the active semiconductor layer comprised of p-type semiconductors of the formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of p-type semiconductors of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally, for example, about +10 volts to about −80 volts is applied to the gate electrode.

Other known materials not recited herein for the various components of the TFT devices of the present disclosure can also be selected in embodiments.

Although not desiring to be limited by theory, it is believed that the tertiary amine center groups function primarily to minimize or avoid instability because of exposure to oxygen and thus increase the oxidative stability of the semiconductor of the formulas as illustrated herein and generated, for example, from monomers containing two tertiary amines for stability primarily, and two thieno end groups in solution under ambient conditions and the substituents, such as alkyl, permit the solubility of these polymers in common solvents, such as ethylene chloride.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductor selected from the group consisting of at least one of Formula (I), Formula (II), or mixtures thereof

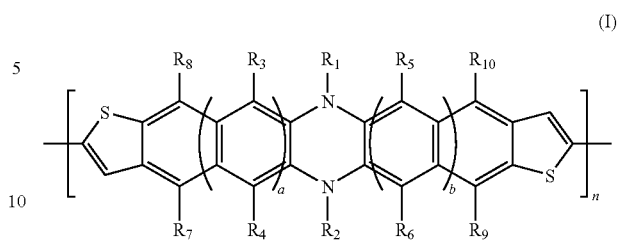

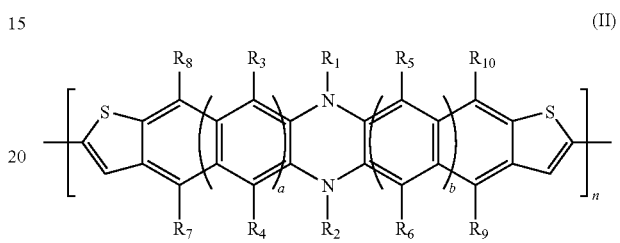

wherein each $R_1$ through $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties.

2. A device in accordance with claim 1 wherein n represents a number of from about 2 to about 5,000, or from 2 to about 2,000.

3. A device in accordance with claim 1 wherein n represents a number of from about 100 to about 1,000.

4. A device in accordance with claim 1 wherein n represents a number of from 2 to about 50.

5. A device in accordance with claim 1 wherein at least one of $R_1$ to $R_{10}$ is alkyl.

6. A device in accordance with claim 1 wherein at least one of $R_1$ to $R_{10}$ is aryl.

7. A device in accordance with claim 1 wherein at least one of $R_3$ to $R_{10}$ is halogen.

8. A device in accordance with claim 1 wherein at least one of $R_3$ to $R_{10}$ is cyano or nitro.

9. A device in accordance with claim 1 wherein $R_1$ and $R_2$ are independently dodecyl, pentylphenyl, or octylphenyl.

10. A device in accordance with claim 1 wherein said semiconductor is a p-type semiconductor generated from monomers containing two tertiary amines and two thieno groups, and which p-type semiconductor is one of the following formulas (1)-(4):

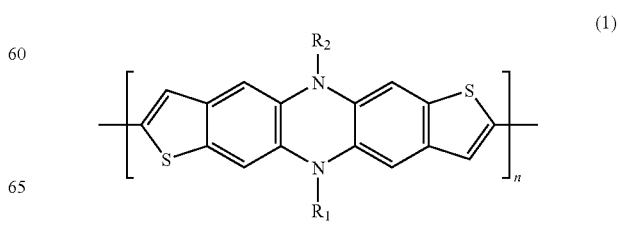

-continued (2)

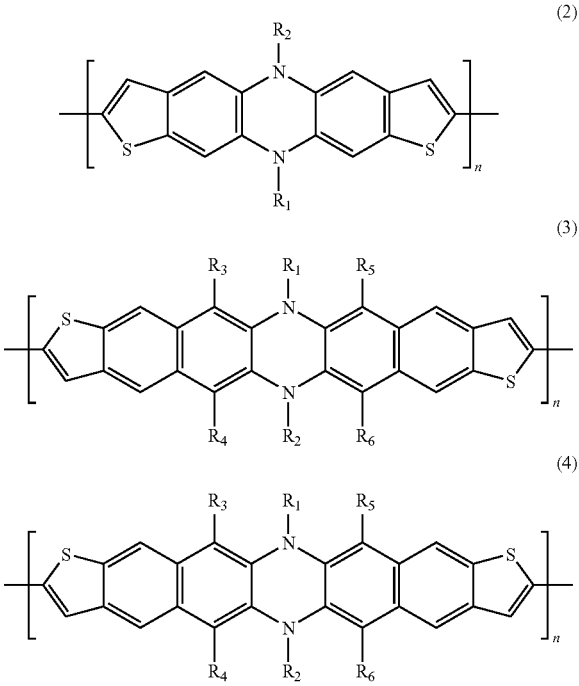

(3)

(4)

wherein at least one of $R_1$ to $R_6$ is alkyl or aryl, and n is a number of from 2 to about 100.

11. A device in accordance with claim 1 wherein each R is aryl containing from 6 to about 36 carbon atoms.

12. A device in accordance with claim 1 wherein alkyl and alkoxy contain from 1 to about 25 carbon atoms, and halogen is chloride, fluoride, iodide, or bromide.

13. A device in accordance with claim 1 wherein alkyl or alkoxy contains from about 1 to about 12 carbon atoms.

14. A device in accordance with claim 1 wherein n is a number of from about 10 to about 200, or from about 20 to about 100.

15. A device in accordance with claim 1 wherein n is about 50.

16. A device in accordance with claim 1 wherein aryl contains from 6 to about 48 carbon atoms.

17. A device in accordance with claim 1 wherein aryl contains from 6 to about 18 carbon atoms.

18. A device in accordance with claim 1 wherein said semiconductor is of Formula I.

19. A device in accordance with claim 1 wherein said semiconductor is of Formula II.

20. A thin film transistor comprised of a substrate, a gate electrode, a gate dielectric layer, a source electrode and a drain electrode, and in contact with the source/drain electrodes and the gate dielectric layer a semiconductor layer comprised of at least one semiconducting component having one of the following formulas:

(I)

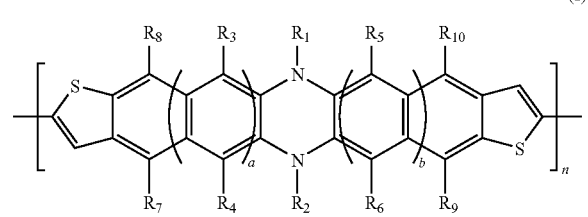

-continued (II)

wherein each $R_1$ through $R_{10}$ is independently hydrogen, alkyl, aryl, alkoxy, halogen, arylalkyl, cyano, or nitro providing that $R_1$ and $R_2$ exclude halogen, nitro and cyano; a and b represent the number of rings; and n represents the number of repeating groups or moieties.

21. A device in accordance with claim 20 wherein alkyl is butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl.

22. A device in accordance with claim 20 wherein said semiconducting component is one of the following formulas (1)-(4):

(1)

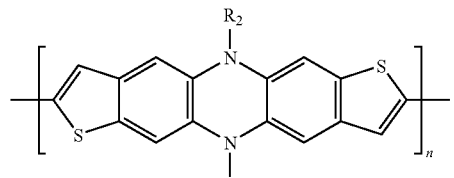

(2)

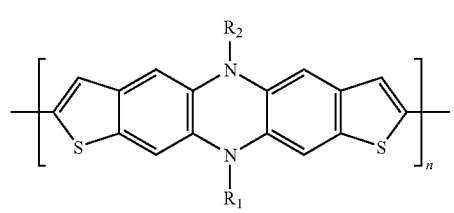

(3)

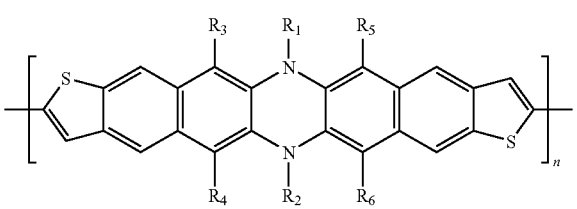

(4)

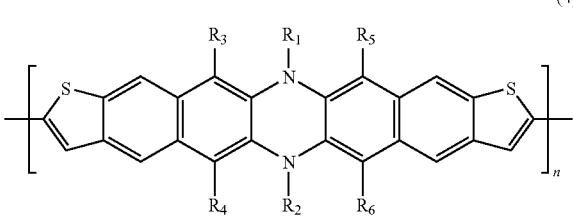

wherein at least one of $R_1$ to $R_6$ is alkyl, aryl, or arylalkyl, and n is a number of from 2 to about 200.

23. A device in accordance with claim 20 wherein said semiconducting component is one of the following formulas (5)-(8):

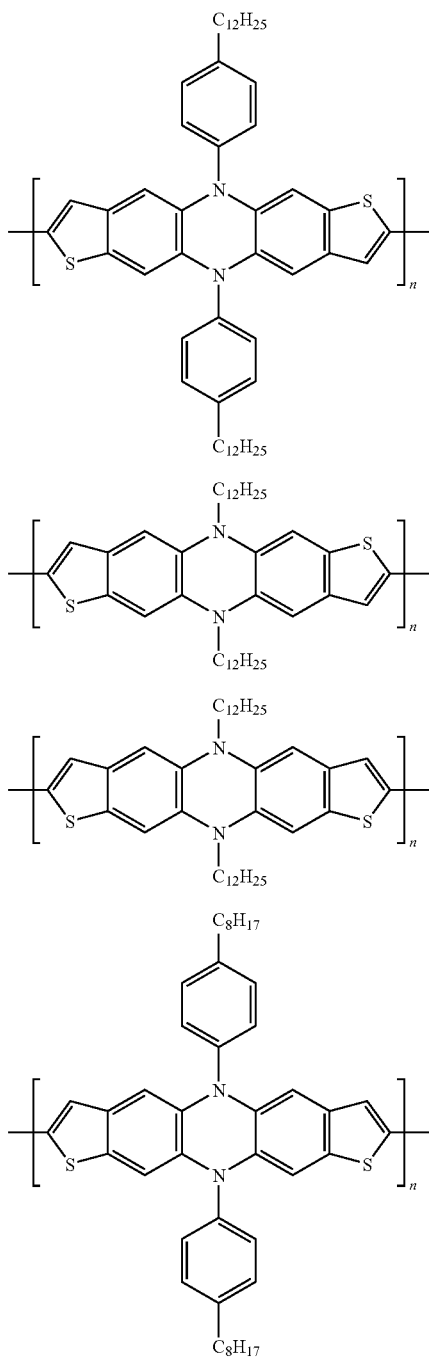

wherein n is from 2 to about 100.

24. A device in accordance with claim 20 wherein said substrate is a plastic sheet of a polyester, a polycarbonate, or a polyimide; said gate source and drain electrodes are each independently comprised of silver, gold, nickel, aluminum, chromium, platinum, or indium titanium oxide, or a conductive polymer; and said gate dielectric layer is comprised of inorganic nitrides or oxides, or organic polymers, silicon nitride, silicon oxide.

25. A device in accordance with claim 20 wherein said semiconductor layer is deposited by solution processes of spin coating, stamp printing, screen printing, or jet printing.

26. An electronic device comprising a semiconductive component and wherein said device is a thin film transistor, and said component is selected from the group consisting of Formula (I), Formula (II), and mixtures thereof

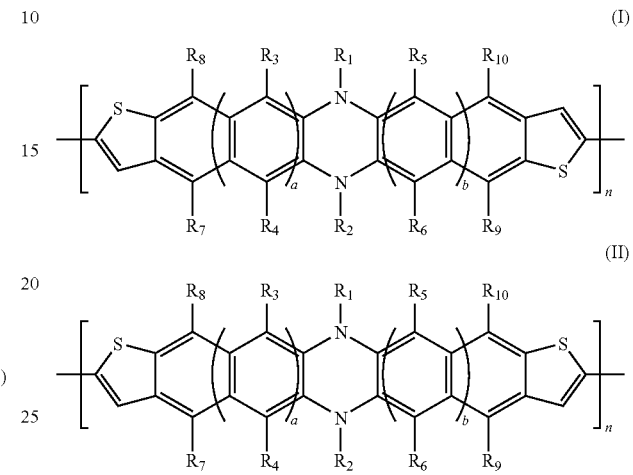

wherein at least one of $R_1$ to $R_{10}$ is a suitable hydrocarbon; a and b represent the number of rings; and n represents the number of repeating units.

27. A device in accordance with claim 1 wherein said arylalkyl contains from 7 to about 37 carbon atoms.

28. A device in accordance with claim 1 wherein said $R_1$ to $R_{10}$ is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethyl, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethyl, perfluoroethyl, perfluoropropyl, pertluorobutyl, perfluoropentyl, perfluorohexyl, perfluoroheptyl, perfluorooctyl, perfluorononyl, perfluorodecyl, perfluoroundecyl, or perfluorodecyl.

29. A device in accordance with claim 1 wherein said aryl or arylalkyl is phenyl, methylphenyl, ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl.

30. A device in accordance with claim 1 wherein a is a number of from zero to about 15.

31. A device in accordance with claim 1 wherein b is a number of from zero to about 15.

32. A device in accordance with claim 1 wherein each a and b is a number of from about 1 to about 4.

33. A device in accordance with claim 1 wherein at least one of $R_3$ to $R_{10}$ is alkyl with from 1 to about 12 carbon atoms, alkoxy with from 1 to about 12 carbon atoms, or aryl with from 6 to about 42 carbon atoms.

* * * * *

UNITED STATES PATENT AND TRADEMARK OFFICE
CERTIFICATE OF CORRECTION

PATENT NO. : 7,563,860 B2  
APPLICATION NO. : 11/399141  
DATED : July 21, 2009  
INVENTOR(S) : Yiliang Wu et al.

Page 1 of 1

It is certified that error appears in the above-identified patent and that said Letters Patent is hereby corrected as shown below:

In the Specifications:

Column 1, line 9, after "Agreement No.", delete "70NANBOH3033" and insert --70NANB0H3033--.

Signed and Sealed this  
Third Day of September, 2013

Teresa Stanek Rea  
*Acting Director of the United States Patent and Trademark Office*